HIGH FREQUENCY BALANCED AMPLIFIER

Filed Oct. 30, 1964 2 Sheets-Sheet 1

INVENTOR
R. S. ENGELBRECHT
BY David P. Kelley
ATTORNEY

Feb. 27, 1968 R. S. ENGELBRECHT 3,371,284

HIGH FREQUENCY BALANCED AMPLIFIER

Filed Oct. 30, 1964 2 Sheets-Sheet 2

United States Patent Office 3,371,284
Patented Feb. 27, 1968

3,371,284

HIGH FREQUENCY BALANCED AMPLIFIER

Rudolf S. Engelbrecht, Bernardsville, N.J., assignor to Bell Telephone Laboratories, Incorporated, New York, N.Y., a corporation of New York Filed Oct. 30, 1964, Ser. No. 407,745
10 Claims. (Cl. 330—31)

ABSTRACT OF THE DISCLOSURE

A balanced four-terminal amplifier utilizes a pair of matched amplifying devices and input and output couplers which divide the input signal equally between the amplifiers and which combine equally the signals from the amplifiers. Such a configuration results in improved impedance matching, gain flatness, phase linearity, and reduces to a minimum critical tuning adjustments.

This invention relates to microwave amplifiers, and more particularly, to such amplifiers utilizing transistors as the active components.

Transistor amplifiers for use in the low microwave range are highly useful primarily because of their essential simplicity and their high power handling capabilities as compared to other types of solid state devices. Despite these advantages, however, conventional types of transistor microwave amplifiers require numerous tuning adjustments to produce wideband flat gain characteristics and good input and output impedance matching. The tuning mechanisms thus introduced into the circuits necessarily add to the complexity of the amplifier and, further, require a considerable amount of time for adjustment to achieve the optimum performance characteristics for the amplifier.

In present-day microwave amplifier applications, it is often the case that the performance characteristics of the amplifier must remain stable with minimum maintenance for long periods, even years. The necessity for numerous critical tuning mechanisms tends to reduce materially the long-term stability of such amplifiers.

In numerous conventional type transistor amplifiers using cascaded stages, it is quite difficult to avoid ripples in the gain curve of the amplifier arising from the rapid variations of transistor input and output impedances with frequency. In addition, with cascaded stages, the failure of a single transistor can result in a failure of the amplifier or, at the least, a material decrease in overall gain.

In general, it is quite difficult to tune a transistor microwave amplifier for simultaneous achievement of matched impedances and low noise.

It is an object of the present invention to produce good impedance matching, gain flatness, phase linearity, and intermodulation characteristics in a transistor microwave amplifier without the use of numerous tuning mechanisms.

It is another object of the present invention to produce microwave amplification in a transistor circuit having optimum impedance match and minimum noise figure simultaneously.

It is still another object of the present invention to produce microwave amplification in a transistor circuit wherein variations in transistor characteristics have relatively little effect on overall gain or impedance match.

These and other objects of the present invention are achieved in an illustrative embodiment thereof which comprises an amplifier stage having a pair of electrically similar transistors. The input signal to the stage is divided by means of a 3 db directional coupler so that half of the input signal is fed to each transistor. The fourth leg of the directional coupler is terminated in a dissipating resistance in order to dissipate any reflections. The outputs of the two transistors are combined in a 3 db output coupler, one leg of which is terminated in a dissipating resistance. With such an arrangement, as will be explained more fully hereinafter, the need for tuning adjustments is eliminated, and yet the input and output impedance matches, gain flatness, and noise performance are equal or superior to the more conventional types of amplifiers having extensive tuning adjustments. Such an arrangement also produces superior reliability, since the failure of one of the transistors reduces the overall gain by only 6 db.

When several stages of the amplifier circuit of the invention are connected in cascade, it is not necessary that all of the transistors be electrically identical. As will be pointed out hereinafter, it is only necessary that each pair of transistors in a stage be electrically similar to each other, within certain tolerances.

It is a feature of the present invention that the amplifier stage in a single or multi-stage amplifier has a pair of electrically similar transistors whose inputs are directly connected to the conjugate arms of an input 3 db coupler and whose outputs are directly connected to the conjugate arms of an output 3 db directional coupler.

These and other objects and features of the present invention will be more readily apparent from the following detailed description, taken in conjunction with the accompanying drawings, in which.

Figure 1:
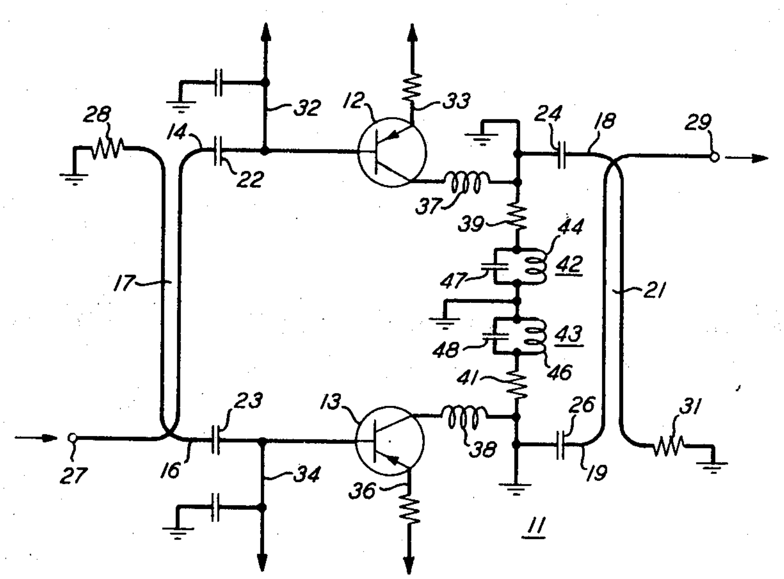
FIG. 1 is a schematic view of a single stage amplifier embodying the principles of the invention.

Turning now to FIG. 1, there is shown an amplifier stage 11 embodying the principles of the present invention.

Stage 11 comprises a pair of transistors 12 and 13 whose inputs are coupled respectively to the conjugate arms 14 and 16 of a 3 db directional coupler 17. The outputs, that is, collectors, of transistors 12 and 13 are connected respectively to the conjugate arms 18 and 19 of an output 3 db directional coupler 21. Blocking capacitors 22, 23, 24 and 26 are provided in each of the conjugate arms of couplers 17 and 21. Input signals are applied at input 27 to the directional coupler 17 while the other arm thereof is terminated in a dissipating resistance 28. In a like manner, amplified signals are taken from output port 29 of coupler 21 while the other arm thereof is terminated in a dissipating resistance 31. Bias voltages are applied to transistor 12 from a suitable voltage source, not shown, through leads 32 and 33, and to transistor 13 through leads 34 and 36.

A 3 db coupler of excellent electrical characteristics can be obtained by means of a coupled pair of parallel transmission lines of proper geometry. Such a coupler, in a strip line configuration, is shown in my copending United States patent application Ser. No. 333,343, filed Dec. 26, 1963. The electrical characteristics of such a coupler are symmetrical about a frequency $f_0$, at which the coupling region is $\lambda/4$ wavelengths long. Over a broadband on either side of $f_0$, the properties of the coupler are such that a signal entering the input port is split into two signals of equal amplitude and 90° phase difference, each signal being one-half the power of the input signal.

If we assume for the moment that the input and output impedances of transistors 12 and 13 are matched to couplers 17 and 21 and that they have the same insertion gain and phase characteristics, the input signals to the two transistors will be amplified and combined in coupler 21 and emerge as a single signal at port 29. No power appears at resistors 28 and 31. Inasmuch as present day couplers are constructed to have substantially ideal characteristics, for example, frequency independent impedance matching over a frequency band of ±30% about $f_0$, any deviation from the ideal behavior just described results mainly from imbalances between transistors 12 and 13.

If we denote the voltage reflection coefficient between coupler 17 and the input impedance of transistor 12 as $\rho_{ai}$ and the corresponding coefficient for transistor 13 as $\rho_{bi}$, then the magnitude of the reflection coefficient seen looking into input 27 is given by $$|\rho_{I}|=\tfrac{1}{2}|\rho_{ai}-\rho_{bi}| \quad (1)$$

In like manner the output reflection coefficients are designated $\rho_{ao}$ and $\rho_{bo}$ and the reflection coefficient seen at input 27 is given by $$|\rho_{II}|=\tfrac{1}{2}|G_{af}G_{ar}\rho_{ao}-G_{bf}G_{br}\rho_{bo}| \quad (2)$$

where $G_{af}$ and $G_{bf}$ are the forward voltage gains of transistors 12 and 13 respectively, and $G_{ar}$ and $G_{br}$ are their respective reverse voltage gains. Finally, we designate the voltage reflection coefficient at the output port 29 as $\rho_c$, which results in a reflection at input port 27 given by $$|\rho_{III}|=\tfrac{1}{4}|(G_{af}+G_{bf})(G_{ar}+G_{br})\rho_c| \quad (3)$$

From the foregoing it can readily be seen that $|\rho_I|$ can be minimized if transistors 12 and 13 are selected to have nearly the same input impedances. In addition $|\rho_{II}|$ and $|\rho_{III}|$ are small when the products $(G_{af}G_{ar})$ and $(G_{bf}G_{br})$ are much less than unity, which implies transistors with high reverse losses. With current production model transistors, input impedances and output impedances matched to within 10% can be achieved in approximately five random tries. Values of $|\rho_I|<0.05$ are readily obtainable, as well as $|\rho_{II}|$ and $|\rho_{III}|$ less than 0.02. Thus under the worst conditions, the total reflection at input port 27, the sum of $|\rho_I|$, $|\rho_{II}|$, and $|\rho_{III}|$ is approximately 0.1 or less. In a like manner, the reflections seen when looking back into the output port 29 can be minimized by selecting transistors having nearly the same output impedances.

Absorbing resistances 28 and 31 function to dissipate the reflections denoted above as $\rho_{ai}$, $\rho_{bi}$, $\rho_{ao}$, and $\rho_{bo}$, thereby preventing them from reaching the input port 27 or the output port 29.

When a number of the described amplifier stages is cascaded, it can be shown that at each interstage connection a ripple component is introduced on the power gain of $$\Delta G/G=\pm\tfrac{1}{2}|(\rho_{ao}-\rho_{bo})(\rho_{ai}-\rho_{bi})| \quad (4)$$

Assuming root means square addition for N interstage connections, the total gain ripple is equal to $$\sqrt{N}\frac{\Delta G}{G}$$

When the transistors are selected in pairs, as discussed heretofore, the factors $(\rho_{ao}-\rho_{bo})$ and $(\rho_{ai}-\rho_{bi})$ are, at worst, approximately 0.1. With $N=4$, we thus obtain total power gain ripples of only ±0.01, or ±0.04 db.

The upper limit to the range of signal levels that can be handled by an amplifier is usually determined by intermodulation and/or gain compression in the last amplifier stage. The type of intermodulation of most concern is usually where two strong signals of $f_A$ and $f_B$ produce third order intermodulation signals $2f_A-f_B$ and $2f_B-f_A$ which fall within the pass band of the amplifier. Gain compression is a decrease in gain as the output signal level approaches the power from the direct current supply. Since the signal power is shared equally by the two transistors in a stage, the signal level at which a given amount of compression or intermodulation is reached is 3 db higher.

In a balanced type amplifier as shown in FIG. 1, it is necessary for optimum performance, to modify the output impedance of the transistors to reduce mismatching, and to use a compensation circuit to achieve a flat gain curve.

The output impedance is modified by connecting inductances 37 and 38 in series with the outputs of transistors

12 and 13, respectively. The inductances are so chosen that the resultant output impedance of each transistor approaches the characteristic impedance of the output 3 db coupler, for example, fifty ohms. With inductances 37 and 38 in the circuit, the output impedance shows a voltage standing wave ratio (VSWR) of less than 2 over a wide bandwidth. When the transistors are matched, as discussed heretofore, this remaining reflection is approximately the same for both transistors, and does not appear at the output port 29.

In the frequency range of 0.8–1.6 kilomegacycles, the gain of commercially available transistors decreases with increasing frequency. In order to achieve a flat gain response over the frequency band, it is necessary to absorb the excess output signal power at the lower frequencies without deteriorating the impedance balance. This flattening of the gain curve is accomplished by filter circuits connected to the output side of the transistors. These filter circuits for transistors 12 and 13 respectively comprise resistances 39, 41, in series with parallel resonant circuits 42, 43, which comprise respectively inductances 44, 46 and capacitors 47, 48. The resonant frequency of circuits 42 and 43 is adjusted to be at or slightly above the highest frequency of interest. At this frequency, essentially no power is absorbed by resistors 39 and 41. At lower frequencies more power is absorbed, with the net result that the gain curve for the overall circuit is essentially flat over the frequency band of interest.

The noise figure of a linear two port transducer is a function of the generator or source admittance. In general, the generator admittance for optimum noise performance is substantially different from that for maximum gain. As a consequence, a simple two-port transducer cannot usually be tuned for minimum noise and maximum gain simultaneously. In the balanced amplifier of the present invention, this can be accomplished if the two transistors 12 and 13 have substantially the same noise characteristics. In this case, it is only necessary that appropriate and identical mismatches between ports 14 and 16 and the inputs to transistors 12 and 13 be provided such that they both see the optimum generator admittance for low noise. Since the mismatches for the two transistors are identical, the input impedance seen at input port 27 remains the same, that is, matched, and any reflections are absorbed in resistive termination 28. The mismatches may take the form of an increased capacitance between the input coupler and the transistors for example.

The circuit of the present invention is especially suited to printed circuit and strip line configurations. The design principles of strip line 3 db couplers, such as is shown in the aforementioned United States application, Ser. No. 333,343, are well known. To obtain symmetrical coupling lines with the proper odd and even mode impedances, the configuration shown in FIG. 2 is employed.

Figure 2:
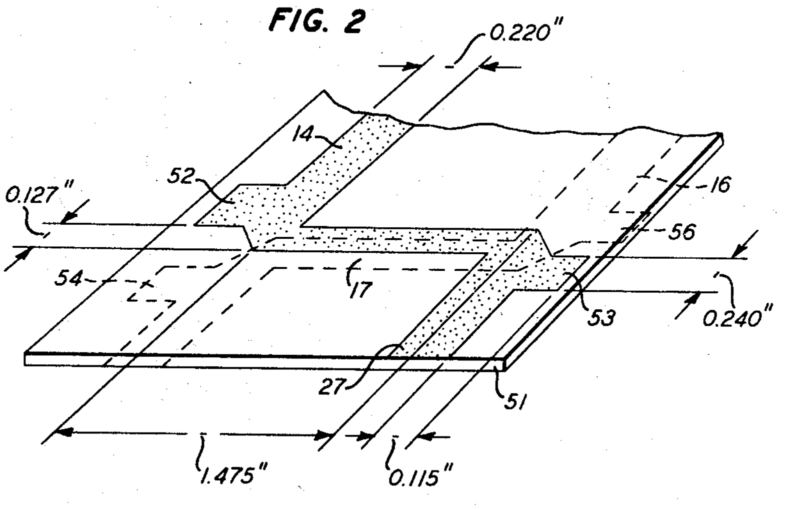
FIG. 2 is a perspective view of a directional coupler for use with the invention.

The coupling arrangement of FIG. 2 comprises a sheet 51 of suitable dielectric material, such as irradiated polyethylene ($\epsilon=2.32$), approximately 0.027 inch thick, which in turn is sandwiched between two sheets (not shown) of identical dielectric material, each approximately 0.125 inch thick. The directional coupler is formed of copper sheets of approximately 2.6 mils thickness. For simplicity, the parts of the coupler of FIG. 2 have been given the same numerical designations as their counterparts in the input coupler of FIG. 1. To compensate for end effects, capacitive pads 52, 53, 54, and 56 have been added. Dimensioned as shown, and sandwiched between identical dielectric sheets with an overall ground-plane spacing of about 0.280 inch, the coupler of FIG. 2 produces completely adequate coupling over the aforementioned frequency range of interest. The capacitive pads may also function as the necessary mismatching means for optimum noise performance. Alternatively, the conductive strips between the coupler and the transistor may be broadened to increase the capacitance.

Figure 3:
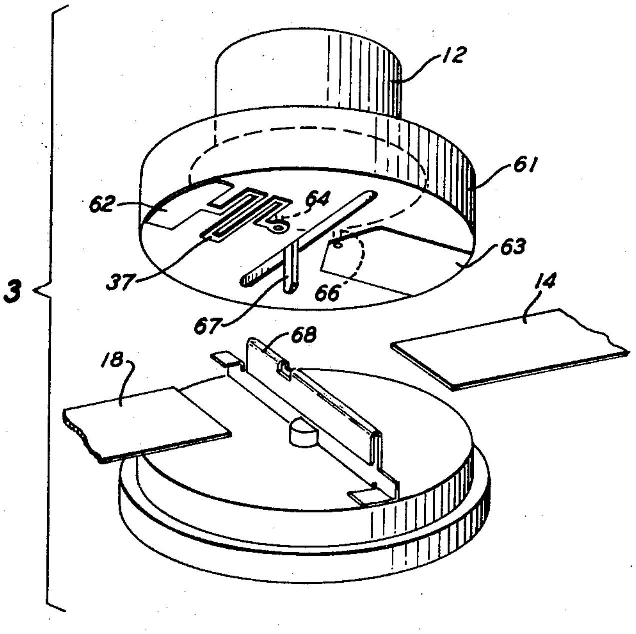
FIG. 3 is a perspective view of a transistor mounting arrangement for use with the invention.

In FIG. 3 there is depicted a particular mounting arrangement for transistor 12, when used as a strip line configuration. The arrangement comprises a disc 61 of suitable insulating material, on the bottom of which are printed conducting tabs 62 and 63. Tab 62 is connected through inductance 37 to collector pin 64, and tab 63 is connected directly to base pin 66. Emitter pin 67 is connected to a spring clip 68 which is in turn connected to the direct-current circuit, not shown. Tab 62 is connected to conjugate arm 18, and tab 63 is connected to conjugate arm 14.

A four-stage amplifier utilizing the circuit of FIG. 1 and the arrangements of FIGS. 2 and 3, and operating in the 0.8 to 1.6 kilomegacycle range, yielded over a 20% and 60% frequency band (60% figures in parentheses):

Gain=20 db±0.2 db (±0.5 db)
Reverse loss>50 db (>40 db)
Phase<±1° from linear (±6°)
VSWR In<1.10 (<1.2)
VSWR Out<1.10 (<1.2)
Noise figures≅6 db
Gain compression ≤.25 db at 0 dbm output signal level
Third order intermodulation: With −3 dbm output power from two signals at frequencies $f_A$ and $f_B$, power out at $2f_A-f_B$ and $2f_B-f_A \cong -50$ dbm.

The transistors were matched within 10% and no adjustments were made. The transistors were operated at $I_e=2$ to 4 ma. and $V_{CB}=5$ to 6 volts.

The foregoing discussion is by way of illustrating the principles of the present invention. Various modifications and changes in the illustrated circuitry may occur to workers skilled in the art without departing from the spirit of the present invention. For example, the principles of the present invention have been shown in a grounded emitter transistor circuit. It is within the purview of workers in the art to utilize other circuit configurations, such as, for example, grounded base or collector configurations.

What is claimed is:

1. An amplifier comprising an input directional coupler having two pairs of conjugate arms, the first of said pairs having one arm terminated in a dissipating member, means for applying a signal to be amplified to the other arm, a first amplifying device connected in circuit to one arm of the second of said conjugate pairs in such a manner that a portion of a signal is applied to said amplifying device whenever the signal is applied to the input of said coupler, a second amplifying device connected in circuit to the other arm of said second conjugate pair in such a manner that a portion of a signal is applied to said second amplifying device whenever the signal is applied to the input of said coupler, said amplifying devices having substantially the same electrical characteristics and being connected in their respective arms in the same manner, and an output directional coupler having two pairs of conjugate arms, one arm of a conjugate pair connected in circuit to one of said amplifying devices and the other arm of said pair connected in circuit to the other of said amplifying devices, one arm of the second conjugate pair of said output directional coupler being terminated in a dissipating member, and means for extracting a signal from the other arm of said second conjugate pair of the output directional coupler.

2. An amplifier as claimed in claim 1 wherein said amplifying devices are transistors.

3. An amplifier as claimed in claim 2 wherein the characteristics of said transistors are matched to within ten percent.

4. An amplifier comprising first and second transistors having substantially the same electrical characteristics, means for applying equally to each of said transistors signals to be amplified, said means comprising an input 3 db directional coupler, having an arm connected to each of said transistors, means for applying a signal to one arm of said coupler and means terminating another arm of said coupler, and means for additively combining the amplified signals from said first and second transistors comprising an output 3 db directional coupler having an arm connected to each of said transistors, an output arm, and another arm which is terminated.

5. An amplifier as claimed in claim 4 and further including means for reducing output mismatches comprising an inductance connected in series between each transistor and the arms of the directional coupler.

6. An amplifier as claimed in claim 4 and further including means for producing a flat gain characteristic over a broad frequency band, said means comprising a resistance and a resonant circuit connected in series with each other and in shunt with the output of each of said transistors.

7. An amplifier as claimed in claim 6 wherein said resonant circuits are resonant at a frequency equal to or greater than the highest frequency of said frequency band.

8. An amplifier comprising first and second transistors having their electrical characteristics matched within ten percent, and the product of their forward and reverse gains less than one, means for applying equally to each of said transistors signals to be amplified, said means comprising a 3 db directional coupler having an arm connected to each of said transistors, means for applying a signal to one arm of said coupler and means for terminating the other arm of said coupler, means for additively combining the amplified signals from said transistors comprising an output 3 db directional coupler having an arm connected to each of said transistors, an output arm, and means for terminating one arm, means for reducing output mismatches, and means for producing a flat gain characteristic over a broad frequency band comprising a resistance and a resonant circuit connected in series with each other and in shunt with the output of each of said transistors.

9. An amplifier as claimed in claim 8 wherein said resonant circuits are resonant at a frequency equal to or greater than the highest frequency of said frequency band.

10. An amplifier as claimed in claim 8 including means for introducing identical mismatches between the inputs of the transistors and the input directional coupler for optimizing low noise performance, said means comprising capacitors in circuit between the input coupler and said transistors.

References Cited

UNITED STATES PATENTS 2,912,581 11/1959 De Lange ............ 250—27

ROY LAKE, *Primary Examiner.*

NATHAN KAUFMAN, *Assistant Examiner.*